(12) United States Patent
Maetani

(10) Patent No.: US 6,441,471 B1
(45) Date of Patent: Aug. 27, 2002

(54) WIRING SUBSTRATE FOR HIGH FREQUENCY APPLICATIONS

(75) Inventor: Maraki Maetani, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/034,191

(22) Filed: Dec. 26, 2001

(30) Foreign Application Priority Data

Dec. 27, 2000 (JP) ........................................ 2000-396635

(51) Int. Cl.⁷ .............................................. H01L 23/52
(52) U.S. Cl. ........................ 257/664; 257/691; 257/698
(58) Field of Search ................................ 257/664, 662, 257/691, 698

(56) References Cited

U.S. PATENT DOCUMENTS

| 4,811,082 | A | * | 3/1989 | Jacobs et al. |
| 4,866,507 | A | * | 9/1989 | Jacobs et al. |
| 4,875,087 | A | * | 10/1989 | Miyauchi et al. |
| 4,890,155 | A | * | 12/1989 | Muyagawa et al. |
| 5,640,048 | A | * | 6/1997 | Selna |
| 5,691,566 | A | * | 11/1997 | Sturdivant |

FOREIGN PATENT DOCUMENTS

| JP | 5-166955 | * | 7/1993 |
| JP | 5-166965 | * | 7/1993 |
| JP | 2605502 | | 2/1997 |

* cited by examiner

Primary Examiner—Sheila V. Clark
(74) Attorney, Agent, or Firm—Hogan & Hartson, LLP

(57) ABSTRACT

A high frequency wiring substrate comprises surface transmission line conductors formed on upper and lower surfaces of a dielectric substrate and surrounded by respective surface ground conductors, and a transmission line interconnect structure for transmitting a high frequency signal between the surface transmission line conductors via an interlayer transmission line conductor surrounded by an interlayer ground conductor and connected at both ends thereof to the respective ends of the surface transmission line conductors by signal conducting through-hole conductors. The surface ground conductors are connected together by two arrays of top-to-bottom through-hole ground conductors, while the interlayer ground conductor is connected to the surface ground conductors by interlayer through-hole ground conductors.

3 Claims, 4 Drawing Sheets

WIRING SUBSTRATE FOR HIGH FREQUENCY APPLICATIONS

BACKGROUND OF THE INVENTION

1. Field of the Invention

The present invention relates to a wiring substrate for high frequency applications that has a transmission line structure for transmitting therethrough a high frequency signal such as a microwave signal, millimeter wave signal, or the like, and more particularly to a wiring substrate for high frequency applications that improves reflection characteristics for high frequency signals at transmission line interconnects between the upper and lower surfaces of a dielectric substrate.

2. Description of the Related Art

In a high frequency wiring substrate that has a transmission line structure for transmitting a high frequency signal therethrough, interconnects between transmission line conductors formed on the upper and lower surfaces of a dielectric substrate have traditionally been achieved using through-hole conductors such as plated via holes, as shown in the perspective view of FIG. 5.

In the perspective view of FIG. 5, the interior of the high frequency wiring substrate is shown by dotted lines. As shown in FIG. 5, surface transmission line conductors 2 and 3 as transmission lines for high frequency signals are formed in line with each other on the upper and lower surfaces of the dielectric substrate 1 consisting of a single or multiple dielectric layers, and the surface transmission line conductors 2 and 3 are connected together at their opposing ends by a signal conducting through-hole conductor 4 such as a plated via hole. On the upper and lower surfaces of the dielectric substrate 1 are also formed surface ground conductors 5 and 6 in such a manner as to surround the respective surface transmission line conductors 2 and 3. The surface transmission line conductors 2, 3 and the surface ground conductors 5, 6 together constitute grounding coplanar transmission lines on the upper and lower surfaces of the dielectric substrate 1, respectively. Further, the surface ground conductors 5 and 6 are connected together by a large number of through-hole ground conductors 7 formed in substantially parallel arrays on both sides of the respective surface transmission line conductors 2 and 3. This structure not only achieves stable grounding of the grounding coplanar transmission lines formed on the upper and lower surfaces of the dielectric substrate 1, but also serves as an impedance matching grounding structure in the area surrounding the signal conducting through-hole conductor 4.

However, in the high frequency wiring substrate of the prior art shown in FIG. 5, as the frequency of the high frequency signal to be transmitted increases, the length of the signal conducting through-hole conductor 4 becomes closer to or nearly the same as the guide wavelength at the signal frequency in the dielectric substrate 1, resulting in the problem that the degree of impedance mismatch increases, increasing the reflection of the high frequency signal; there has also been the problem that since the thickness of the dielectric layer also becomes close to the guide wavelength at the signal frequency in the dielectric layer, unwanted mode conversion to parallel plate mode or waveguide mode occurs within the dielectric layer, degrading the transmission characteristics.

In view of increasing frequency of high frequency signals to be transmitted, it is desired to realize a transmission line structure that can transmit high frequency signals between transmission line conductors on the upper and lower surfaces of the dielectric substrate without degrading the transmission characteristics.

SUMMARY OF THE INVENTION

The present invention has been devised in view of the above problems of the prior art, and an object of the invention is to provide a wiring substrate for high frequency applications that has a transmission line interconnect structure capable of efficiently transmitting signals in high frequency regions including microwave and millimeter wave regions, by improving the reflection characteristics of high frequency signals at transmission line interconnects between the upper and lower surfaces of a dielectric substrate and suppressing the occurrence of conversion to an unwanted mode within the dielectric substrate.

The present invention provides a wiring substrate for high frequency applications, comprising: a pair of surface transmission line conductors formed in line with each other on upper and lower surfaces of a dielectric substrate composed of a stack of dielectric layers, each of the surface transmission line conductors being surrounded by a surface ground conductor; and a transmission line interconnect structure for transmitting a high frequency signal between the pair of surface transmission line conductors via an interlayer transmission line conductor formed between the dielectric layers in such a manner as to be in line with and parallel to the pair of surface transmission lines, the interlayer transmission line conductor being surrounded by an interlayer ground conductor and connected at both ends thereof to the respective ends of the pair of surface transmission line conductors by signal conducting through-hole conductors, wherein in the transmission line interconnect structure, the surface ground conductors on the upper and lower surfaces are connected together via the interlayer ground conductor by top-to-bottom through-hole ground conductors arranged in two parallel arrays spaced a prescribed distance apart from each other on both sides of the interlayer transmission line conductor, while the interlayer ground conductor is connected to the surface ground conductors on the upper and lower surfaces by interlayer through-hole ground conductors arranged in an array at a prescribed pitch along each of two sides extending perpendicularly to the interlayer transmission line conductor; and the thickness of each of the dielectric layers, representing the spacing between the interlayer transmission line conductor and the respective surface transmission line conductors, and the length of a straight line section of the interlayer transmission line conductor between the signal conducting through-hole conductors are each set not larger than one quarter of a signal wavelength of the high frequency signal, while through-hole ground conductors for connecting the surface ground conductors on the upper and lower surfaces are formed in a region where the interlayer ground conductor is not formed between the interlayer transmission line conductor and the top-to-bottom through-hole ground conductors arranged parallelly on both sides of the interlayer transmission line conductor, and are arranged at a pitch not larger than a prescribed pitch that has the frequency of the high frequency signal as a cutoff frequency.

Furthermore, the invention also provides a wiring substrate for high frequency applications, comprising:
 (a) a dielectric substrate composed of a stack of dielectric layers;
 (b) a first surface transmission line conductor formed in a straight line on one surface of the dielectric substrate;
 (c) a second surface transmission line conductor formed in a straight line on the other surface of the dielectric substrate;
 (d) a first surface ground conductor formed to surround the first surface transmission line conductor;

(e) a second surface ground conductor formed to surround the second surface transmission line conductor; and (f) a transmission line interconnect structure for transmitting a high frequency signal between the first surface transmission line conductor and the second surface transmission line conductor, the transmission line interconnect structure comprising:

(f1) an interlayer transmission line conductor formed in a straight line between the dielectric layers;

(f2) an interlayer ground conductor formed between the dielectric layers in such a manner as to surround the interlayer transmission line conductor;

(f3) signal conducting through-hole conductors for connecting the first surface transmission line conductor to the interlayer transmission line conductor, and for connecting the second surface transmission line conductor to the interlayer transmission line conductor;

(f4) first through-hole ground conductors, arranged in two parallel arrays spaced a prescribed distance apart from each other on both side of the interlayer transmission line conductor, for connecting the first surface ground conductor to the second surface ground conductor via the interlayer ground conductor;

(f5) second through-hole ground conductors for connecting the first surface ground conductor to the interlayer ground conductor, and for connecting the second surface ground conductor to the interlayer ground conductor, the second through-hole ground conductors being arranged in an array at a prescribed pitch along each of two sides extending perpendicularly to the interlayer transmission line conductor; and (f6) third through-hole ground conductors for connecting the first surface ground conductor to the second surface ground conductor, the third through-hole ground conductors being formed in a region where the interlayer ground conductor is not formed between the interlayer transmission line conductor and the first through-hole ground conductors arranged parallelly on both sides of the interlayer transmission line conductor, wherein a thickness of each of the dielectric layers, representing the spacing between the interlayer transmission line conductor and the first and second surface transmission line conductors, and a length of a straight line section of the interlayer transmission line conductor between the signal conducting through-hole conductors are each set not larger than one quarter of a signal wavelength of the high frequency signal, and the third through-hole ground conductors are arranged at a pitch not larger than a prescribed pitch that has the frequency of the high frequency signal as a cutoff frequency.

According to the high frequency wiring substrate of the present invention, since the surface transmission line conductors on the upper and lower surfaces of the dielectric substrate are connected together using the above-described transmission line interconnect structure, the signal conducting through-hole conductors provided at both ends of the interlayer transmission line conductor can each be held shorter than the guide wavelength in the dielectric substrate. Further, since the interlayer ground conductor, which serves as a ground plane in the high frequency transmission line structure having the upper (lower) surface transmission line conductor as the signal conductor, is connected by the interlayer through-hole ground conductors to the lower (upper) surface ground conductor which serves as a ground plane in the high frequency transmission line structure having the interlayer transmission line conductor as the signal conductor, ground discontinuities where the structure changes are eliminated, and therefore, the increase in reflections due to the signal conducting through-hole conductors and the interlayer transmission line conductor connecting between the upper and lower surface transmission line conductors can be held low. Generally, between discontinued points along a transmission line, there can exist a standing wave such that the spacing between the discontinued points becomes equal to an integral multiple of a half wavelength; however, in the present invention, since the straight line section of the interlayer transmission line conductor between the signal conducting through-hole conductors is set not longer than one quarter of the guide wavelength of the high frequency signal, the wavelength of the standing wave occurring between the discontinued points at the signal conducting through-hole conductors connected to both ends of the interlayer transmission line conductor can be shifted to a frequency region higher than the signal frequency. Further, in a rectangular waveguide structure, the cutoff frequency increases as the length of the longer side of the cross section decreases; in view of this, the through-hole ground conductors for connecting the upper and lower surface ground conductors, which are formed in the region where the interlayer ground conductor is not formed between the interlayer transmission line conductor and the top-to-bottom through-hole ground conductors arranged parallelly on both sides of the interlayer transmission line conductor, are arranged at a pitch not larger than the prescribed pitch that has the frequency of the high frequency signal as the cutoff frequency. As a result, the cutoff frequency of the dielectric waveguide transmission line structure can also be shifted to a frequency region higher than the signal frequency, the dielectric waveguide transmission line structure here comprising: the top-to-bottom through-hole conductors arranged in two parallel arrays spaced a prescribed distance apart from each other on both sides of the interlayer transmission line conductor and extending along the signal transmission direction thereof in such a manner as to surround the interlayer transmission line conductor; the upper and lower surface ground conductors; the interlayer transmission line conductor; and the through-hole ground conductors for connecting the upper and lower surface ground conductors, which are formed in the region where the interlayer ground conductor is not formed between the interlayer transmission line conductor and the top-to-bottom through-hole ground conductors arranged parallelly on both sides of the interlayer transmission line conductor. This improves the reflection characteristics of high frequency signals at the transmission line interconnects between the upper and lower surfaces of the dielectric substrate and suppresses the occurrence of conversion to an unwanted mode within the dielectric substrate; as a result, the high frequency wiring substrate thus constructed has the transmission line interconnect structure capable of efficiently transmitting signals in high frequency regions including microwave and millimeter wave regions.

As described above, according to the high frequency substrate of the present invention, which comprises a pair of surface transmission line conductors formed in line with each other on the upper and lower surfaces of a dielectric substrate, each surface transmission line conductor being surrounded by a surface ground conductor, and a transmission line interconnect structure for transmitting a high frequency signal between the surface transmission line conductors via an interlayer transmission line conductor formed between the dielectric layers in such a manner as to be in line with and parallel to the surface transmission lines, the interlayer transmission line conductor being surrounded by an interlayer ground conductor and connected at both ends thereof to the respective ends of the surface transmission line conductors by signal conducting through-hole conductors, the transmission line interconnect structure is characterized in that: the surface ground conductors on the upper and lower surfaces are connected together via the interlayer ground conductor by top-to-bottom through-hole ground conductors arranged in two parallel arrays spaced a prescribed distance apart from each other on both sides of the interlayer transmission line conductor, while the interlayer ground conductor is connected to the surface ground conductors on the upper and lower surfaces by interlayer through-hole ground conductors arranged in an array at a prescribed pitch along each of two sides extending perpendicularly to the interlayer transmission line conductor; and the thickness of each of the dielectric layers, representing the spacing between the interlayer transmission line conductor and the respective surface transmission line conductors, and the length of the straight line section of the interlayer transmission line conductor between the signal conducting through-hole conductors are each set not larger than one quarter of the signal wavelength of the high frequency signal, while through-hole ground conductors for connecting the surface ground conductors on the upper and lower surfaces are formed in a region where the interlayer ground conductor is not formed between the interlayer transmission line conductor and the top-to-bottom through-hole ground conductors arranged parallelly on both sides of the interlayer transmission line conductor, and are arranged at a pitch not larger than a prescribed pitch that has the frequency of the high frequency signal as the cutoff frequency. With the structure, the increase in the inductance component associated with the signal conducting through-hole conductors and the interlayer transmission line conductor connecting between the upper and lower surface transmission line conductors can be held low. Furthermore, the wavelength of the standing wave occurring between the discontinued points at the signal conducting through-hole conductors connected to both ends of the interlayer transmission line conductor can be shifted to a frequency region higher than the signal frequency. At the same time, the cutoff frequency of the dielectric waveguide transmission line structure formed in such a manner as to surround the interlayer transmission line conductor can also be shifted to a frequency region higher than the signal frequency. This improves the reflection characteristics of high frequency signals at the transmission line interconnects between the upper and lower surfaces of the dielectric substrate and suppresses the occurrence of conversion to an unwanted mode within the dielectric substrate; as a result, the high frequency wiring substrate thus constructed has the transmission line interconnect structure capable of efficiently transmitting signals in high frequency regions including microwave and millimeter wave regions.

In the invention it is preferable that the distance between the two arrays of top-to-bottom through-hole ground conductors is set about twice the spacing between the pair of surface transmission line conductors.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
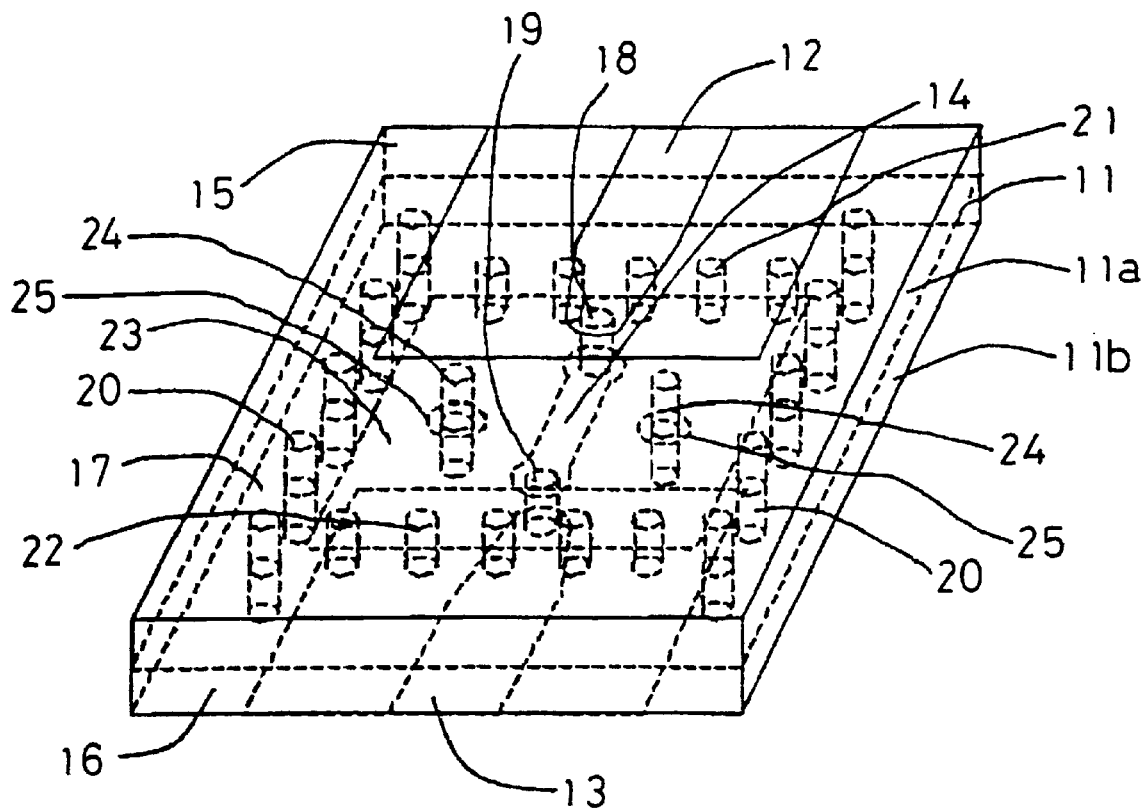
FIG. 1 is a perspective view showing one embodiment of a high frequency wiring substrate according to the present invention.

Now referring to the drawings, preferred embodiments of the invention are described below.

Figure 2:
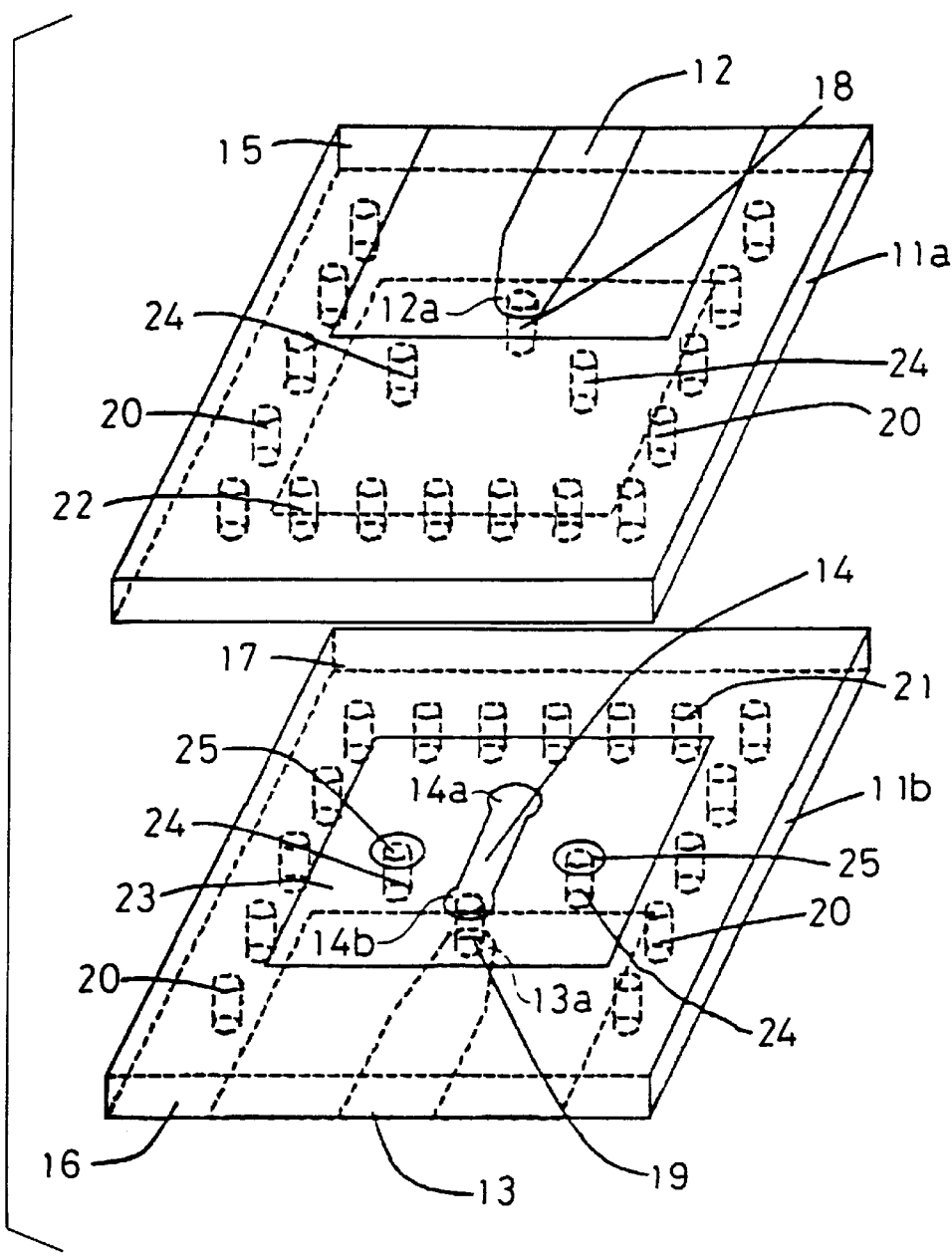
FIG. 2 is an exploded perspective view showing the one embodiment of a high frequency wiring substrate according to the present invention.
Figure 3:
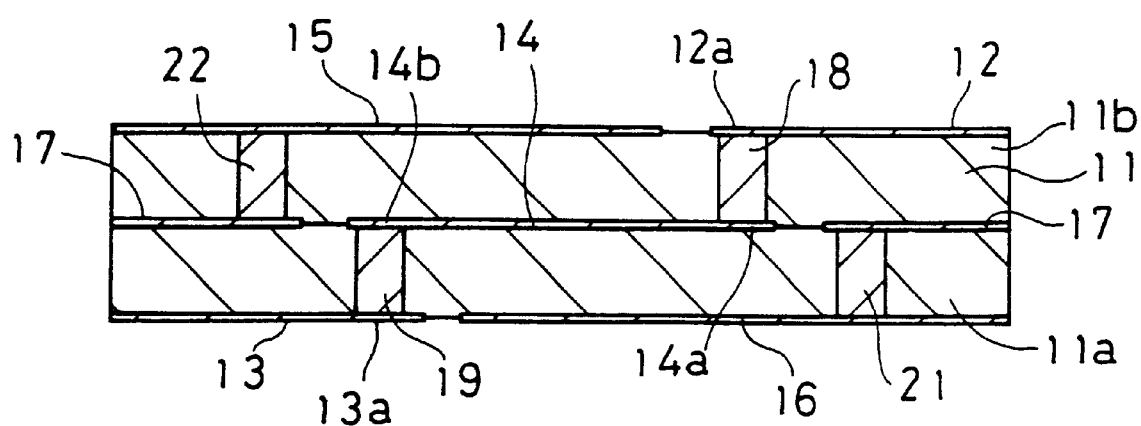
FIG. 3 is a cross sectional view showing the one embodiment of a high frequency wiring substrate according to the present invention.

FIG. 1 is a perspective view showing one embodiment of a high frequency wiring substrate according to the present invention. FIG. 2 is an exploded perspective view of the high frequency wiring substrate of FIG. 1, and FIG. 3 is a cross sectional view taken along a direction parallel to the transmission line conductors formed on the high frequency wiring substrate of FIG. 1. In the perspective view of FIG. 1, the interior of the high frequency wiring substrate is shown by dotted lines.

In the above figures, the high frequency wiring substrate comprises a dielectric substrate 11, surface transmission line conductors 12 and 13 as first and second surface transmission line conductors, an interlayer transmission line conductor 14, surface ground conductors 15 and 16 as first and second surface ground conductors, and a transmission line interconnect structure. The dielectric substrate 11 is composed of a stack of dielectric layers 11a, 11b (in this embodiment, two layers). In other words, the dielectric layers 11a and 11b together constitute the dielectric substrate 11. The surface transmission line conductors 12 and 13 are formed in line with each other, one on one surface, i.e., the upper surface, of the dielectric substrate 11 and the other on the other surface, i.e., the lower surface. The interlayer transmission line conductor 14 is formed between the dielectric layers 11a and 11b in such a manner to be in line with and parallel to the surface transmission line conductors 12 and 13. The surface ground conductors 15 and 16 are formed in such a manner as to surround the respective surface transmission line conductors 12 and 13 on the upper and lower surfaces of the dielectric substrate 11.

The transmission line interconnect structure comprises an interlayer ground conductor 17, signal conducting through-hole conductors 18 and 19, top-to-bottom through-hole ground conductors 20 as first through-hole ground conductors, interlayer through-hole ground conductors 21 and 22 as second through-hole ground conductors, and through-hole ground conductors 24 as third through-hole ground conductors. The interlayer ground conductor 17 is formed between the dielectric layers 11a and 11b in such a manner as to surround the interlayer transmission line conductor 14. Therefore, a microstrip transmission line is formed by the surface transmission line conductor 12 and interlayer ground conductor 17 with the dielectric layer 11a as its base. Likewise, a microstrip transmission line is formed by the surface transmission line conductor 13 and interlayer ground conductor 17 with the dielectric layer 11b as its base. A strip transmission line (triplate transmission line) is formed by the interlayer line conductor 14 and the surface ground conductors 15 and 16 with the dielectric layers 11a and 11b as its base. The signal conducting through-hole conductors 18 and 19, the top-to-bottom through-hole ground conductors 20, the interlayer through-hole ground conductors 21 and 22, and the through-hole ground conductors 24 will be described later.

In the example shown in FIGS. 1 to 3, the surface ground conductors 15 and 16 extend parallelly on both sides of the respective surface transmission line conductors 12 and 13 in such a manner as to surround the respective transmission line conductors, but this does not necessarily mean a coplanar transmission line structure. That is, if the gap between the surface transmission line conductor 12, 13 and the surface ground conductor 15, 16 is essentially wider than the transmission line width, the structure can be regarded as a microstrip transmission line. FIG. 1 shows an example of the structure that can be regarded as a microstrip transmission line.

Further, since the distances in the signal transmission direction from the surface transmission line conductor 12 to the surface ground conductor 15, from the surface transmission line conductor 13 to the surface ground conductors 16 and from the interlayer transmission line conductor 14 to the interlayer ground conductor 17 correspond to distances of portions of their associated ground planes from which portions respective ground conductors are removed, in the microstrip transmission lines (surface transmission line conductor 12+interlayer ground conductor 17 and surface transmission line conductor 13+interlayer ground conductor 17) and the strip transmission line (interlayer transmission line conductor 14+surface ground conductors 15 and 16), respectively, it is desirable that the distances be made as small as the manufacturing process can allow.

The signal conducting through-hole conductors 18 and 19 connect the end of the surface transmission line conductor 12 to one end of the interlayer transmission line conductor 14 and the end of the surface transmission line conductor 13 to the other end of the interlayer transmission line conductor 14.

Here, to prevent positional displacements of the signal conducting through-hole conductors 18 and 19 due to layer registration errors, land portions 14a and 14b, substantially circular in shape, are formed at both ends of the interlayer transmission line 14. The diameter of the land portions 14a and 14b is usually not equal to the width of the straight line section of the interlayer transmission line conductor 14; considering this, the entire length of the interlayer transmission line conductor 14 minus the length equal to the diameters of the land portions 14a and 14b is defined as the length of the straight line section of the interlayer transmission line conductor 14. The length of the straight line section is set not greater than one quarter of the signal wavelength of the high frequency signal, and the thickness of each of the dielectric layers 11a and 11b between the interlayer transmission line conductor 14 and the upper and lower surface transmission line conductors 12 and 13, that is, the length of each of the signal conducting through-hole conductors 18 and 19 connecting between the interlayer transmission line conductor 14 and the respective surface transmission line conductors 12 and 13, is also set not greater than one quarter of the signal wavelength of the high frequency signal. With this structure, the length of each of the signal conducting through-hole conductors 18 and 19 provided at the respective ends of the interlayer transmission line conductor 14 can be held shorter than the guide wavelength in the dielectric substrate 11. Further, since the interlayer ground conductor 17, which corresponds to the ground plane in the high frequency transmission line structure having the upper (lower) transmission line conductor 12 (13) as the signal conductor, is connected by the interlayer through-hole ground conductors 21 (22) to the lower (upper) surface ground conductor 13 (12), which corresponds to the ground plane in the high frequency transmission line structure having the interlayer transmission line conductor 14 as the signal conductor, ground discontinuities where the high frequency transmission line structure changes are eliminated. This serves to alleviate the effects caused by discontinuities in the characteristic impedance of the high frequency transmission line at transmission line interconnects constructed of the microstrip transmission line/strip transmission line/microstrip transmission line structure.

The top-to-bottom through-hole ground conductors 20 are arranged in two parallel arrays spaced a prescribed distance apart from each other on both sides of the interlayer transmission line conductor 14, and connect the upper and lower surface ground conductors 15 and 16 via the interlayer ground conductor 17. The interlayer through-hole ground conductors 21 and 22 are arranged in an array at a prescribed pitch along each of two sides extending perpendicularly to the interlayer transmission line conductor 14, and connect the upper surface ground conductor 15 to the interlayer ground conductor 17 and the lower surface ground conductor 16 to the interlayer ground conductor 17.

More specifically, the interlayer through-hole ground conductors 21 are formed passing through the dielectric layer 11b in its thickness direction and arranged at a prescribed pitch in an array on one side extending perpendicularly to the interlayer transmission line conductor 14. On the other hand, the interlayer through-hole ground conductors 22 are formed passing through the dielectric layer 11a in its thickness direction and arranged at a prescribed pitch in an array on the other side extending perpendicularly to the interlayer transmission line conductor 14.

The top-to-bottom through-hole ground conductors 20 and the interlayer through-hole ground conductors 21 and 22 should in their respective arrays be formed as closely spaced and as many as the manufacturing process can allow, because the high frequency grounding at the respective portions can then be reinforced. For example, the through-hole conductors in each top-to-bottom through-hole ground conductor array 20 and in each interlayer through-hole ground conductor array 21, 22 should be arranged as closely spaced as possible at a pitch smaller than one half of the signal wavelength of the high frequency signal. This pitch need not necessarily be fixed, but may be made variable as long as the pitch is held smaller than one half of the signal wavelength of the high frequency signal. Further, the distance, that is, the spacing, between the two top-to-bottom through-hole ground conductor arrays 20 should preferably be set about twice the spacing between the upper and lower surface transmission line conductors 12 and 13. In that case, the top-to-bottom through-hole ground conductors 20 and the surface ground conductors 15 and 16 together form a dielectric waveguide transmission line structure surrounding the interlayer transmission line conductor 14, and the structure effectively acts as an electromagnetic shield.

In the high frequency wiring substrate of the invention, it is important that the through-hole ground conductors 24 connecting between the upper surface ground conductor 15 and the lower surface ground conductor 16 be arranged at a pitch not larger than the spacing that has the frequency of the high frequency signal as the cutoff frequency, in a region 23 where the interlayer ground conductor 17 is not formed between the top-to-bottom through-hole ground conductor arrays 20 arranged parallelly on both sides of the interlayer transmission line conductor 14.

The pitch at which the through-hole ground conductors 24 are arranged is not larger than the spacing that has the frequency of the high frequency signal as the cutoff frequency. For example, when two dielectric layers each having a thickness of 0.2 mm and a dielectric constant of 8.8 is stacked one on top of the other, then the structure constructed from such a stack can be regarded as a dielectric waveguide whose spacing in the vertical direction is 0.4 mm, and when the spacing in the horizontal direction relative to the direction of transmission is 0.9 mm, 0.8 mm, and 0.7 mm, then the cutoff frequency is about 56.2 GHz, 63.2 GHz, and 72.2 GHz, respectively. When designing the structure with the signal frequency upper limit at 66 GHz, the through-hole ground conductors 24 are arranged at a pitch of 0.7 mm. This pitch should be made as small as possible in order to suppress the waveguide mode. However, if the pitch is made too small, it will affect the impedance of the high frequency transmission line structure having the interlayer transmission line conductor 14 as the signal conductor; therefore, the through-hole ground conductors 24 should be arranged so that their lands 25 (to be described later) are each spaced from the interlayer transmission line conductor 14 by a distance not smaller than the thickness of one dielectric layer (in the above example, 0.2 mm). Further, the through-hole ground conductors 24 to be formed at positions parallel to the interlayer transmission line conductor 14 should be arranged at positions substantially coinciding with the midpoint of the straight line section of the interlayer transmission line conductor 14 so that the waveguide mode suppression effect can be provided equally at both ends of the interlayer transmission line conductor 14.

Further, the through-hole ground conductors 24 and the two arrays of top-to-bottom through-hole ground conductor 20 need not necessarily be separated by an equal distance from the respective sides of the interlayer transmission line conductor 14, and one may be arranged closer to the interlayer transmission line conductor 14 than the other is, provided that the arrangement does not affect other requirements, for example, the impedance of the high frequency transmission line structure having the interlayer transmission line conductor 14 as the signal conductor; however, usually they should be arranged symmetrically on both sides of the interlayer transmission line conductor 14.

Moreover, more than one through-hole ground conductor 24 may be arranged on each side of the interlayer transmission line conductor 14; in that case, the through-hole ground conductors 24 should preferably be arranged avoiding the positions on both sides of the signal conducting through-hole conductors 18 and 19 so as not to affect the impedance design at the microstrip transmission line/strip transmission line conversion point.

The lands 25 substantially circular in shape are formed in the region where the interlayer ground conductor 17 is not formed. The lands 25 are formed between the upper dielectric layer 11a and the lower dielectric layer 11b to prevent positional displacements of the through-hole ground conductors 24 due to layer registration errors.

According to the high frequency wiring substrate of the invention, by arranging the through-hole ground conductors 24 as describe above, a dielectric waveguide transmission line structure having a thickness equal to the combined thickness of the dielectric layers 11a and 11b is formed for the interlayer transmission line conductor 14 which serves as an interconnect between the upper surface transmission line conductor 12 and the lower surface transmission line conductor 13. The cutoff frequency, that is, the lower limit of the frequency that can be propagated in the waveguide mode through the interior of the waveguide structure, is defined by the width of the waveguide. When the through-hole ground conductors 24 are arranged on both sides of the interlayer transmission line conductor 14 at a pitch not larger than the spacing that has as the cutoff frequency the frequency of the high frequency signal transmitted through the transmission line interconnect structure, that is, at a pitch having a higher cutoff frequency, the cutoff frequency for the waveguide mode, an unwanted mode, can be made higher without affecting the transmission in the TEM mode, i.e., the transmission mode in the high frequency transmission line structure having the interlayer transmission line conductor 14 as the signal conductor. This makes it possible to suppress the occurrence of the waveguide mode in the strip transmission line section consisting of the interlayer transmission line conductor 14 and surface ground conductors 15 and 16 and having as its base the dielectric substrate 11 formed from the dielectric layers 11a and 11b. As a result, it becomes possible to suppress the occurrence of mode conversion from the TEM mode, the desired mode, to the waveguide mode, an unwanted mode, within the dielectric substrate 11. This achieves efficient transmission in the TEM mode which is the desired mode.

Embodiments

Next, the high frequency wiring substrate of the invention will be described by way of example.

First, the dielectric substrate 11 was fabricated by stacking two dielectric layers 11a and 11b each made of alumina ceramics having a dielectric constant of 8.8 and a thickness of 0.2 mm. Microstrip transmission lines (each with a strip line width of 0.22 mm) as the surface transmission line conductors 12 and 13 were formed in line with each other on the upper and lower surfaces, respectively. Each microstrip transmission line was formed at its end with a land portion 12a or 13a (with a diameter of 0.15 mm) for connecting there to a signal conducting via (with a diameter 0.1 mm) formed as the signal conducting through-hole conductor 18 or 19. The signal conducting vias connected to the respective land portions 12a and 13a were formed passing through the respective dielectric layers 11a and 11b, and connected to the interlayer transmission line conductor 14, a strip transmission line (with a strip line width of 0.1 mm), formed between the dielectric layers 11a and 11b and having signal conducting via connecting land portions 14a and 14b (each with a diameter of 0.15 mm) at both ends thereof. The signal conducting vias were spaced apart from each other by 0.5 mm in the signal propagation direction.

The surface ground conductors 15 and 16 and the interlayer ground conductor 17 were formed in such a manner as to surround the surface transmission line conductors 12 and 13 formed on the upper and lower surfaces of the dielectric substrate 11 and the interlayer transmission line conductor 14 formed between the layers, respectively, each ground conductor being separated from the end of its associated transmission line conductor by a distance of 0.15 mm in the signal propagation direction. The surface ground conductors 15 and 16 were connected to the interlayer ground conductor 17 by ground vias, i.e., the through-hole ground conductors 20, 21, and 22 formed at a pitch of 0.25 mm. Further, ground vias as the through-hole ground conductors 24 were formed at a pitch of 0.25 mm parallelly on both sides of the interlayer transmission line conductor 14 to connect the upper and lower surface ground conductors 12 and 13, the ground vias being located at a distance of 0.6 mm from the centerline of the layer transmission line conductor 14. The high frequency wiring substrate A of the invention was fabricated with the above configuration.

As a comparative example, using the same material and layer structure as described above, grounding coplanar transmission lines (each with a strip line width of 0.22 mm and a stripline to ground conductor gap of 0.14 mm) were formed as the upper and lower surface transmission line conductors; the surface transmission line conductors were connected by signal conducting vias, i.e, the signal conducting through-hole conductors formed through the respective dielectric layers, and the upper and lower surface ground conductors were connected by ground vias, i.e., the top-to-bottom through-hole ground conductors formed through the respective dielectric layers, to fabricate the high frequency wiring substrate B of the prior art configuration.

Next, S parameters, associated with the high frequency transmission from the surface transmission line conductor formed on the upper surface of the multilayer substrate to the lower surface transmission line conductor via the signal conducting vias and the interlayer transmission line conductor, were measured on the high frequency wiring substrates A and B by using a network analyzer, and S11 as the reflection coefficient of each substrate was obtained. The reflection coefficient versus frequency characteristics are shown in FIG. 4.

Figure 4:
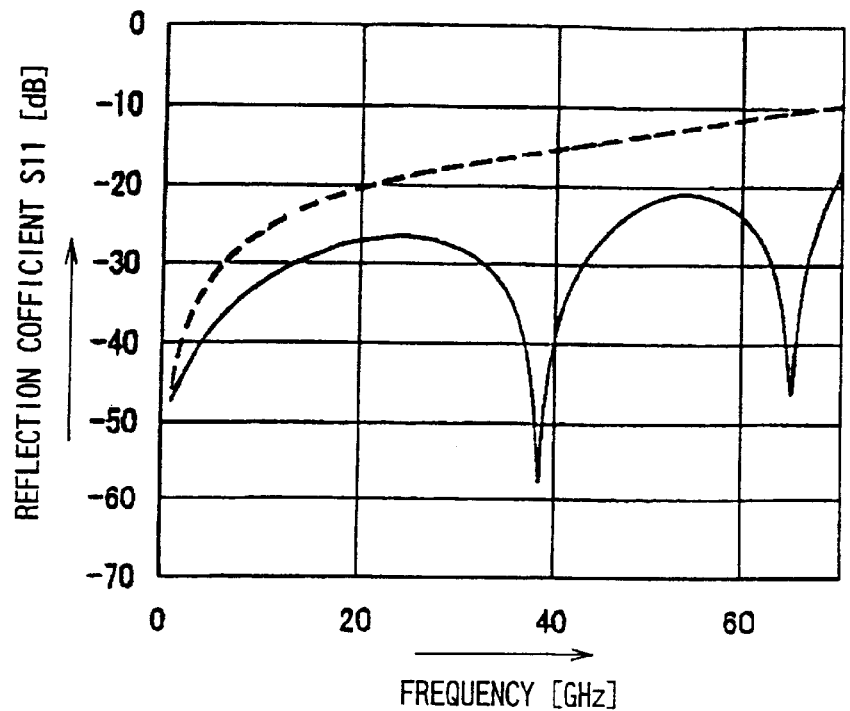
FIG. 4 is a diagram showing the reflection coefficient versus frequency characteristics of the high frequency wiring boards of the embodiment and a comparative example.
Figure 5:
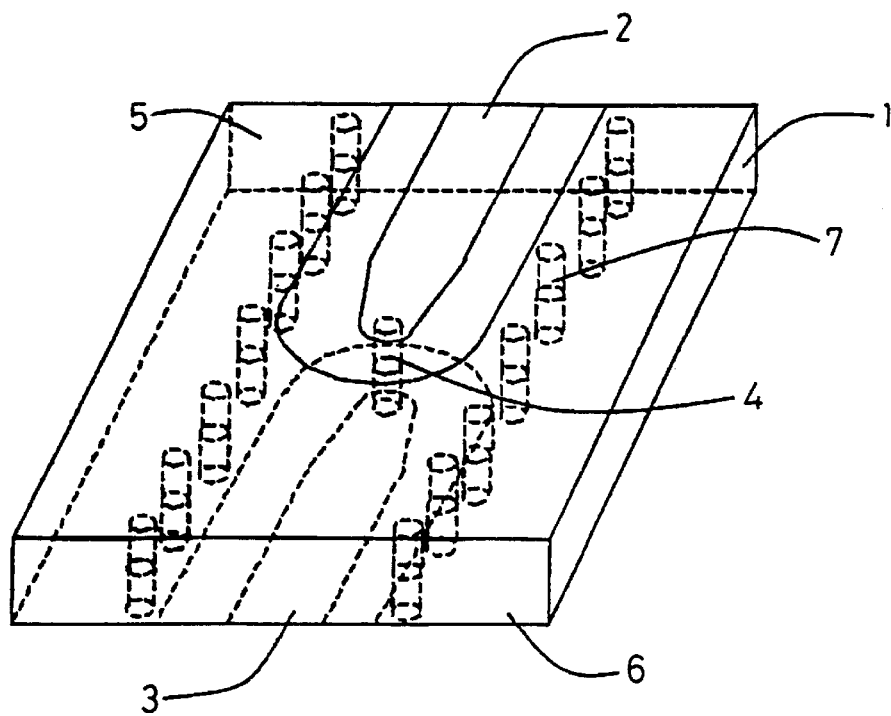
FIG. 5 is a perspective view showing one example of a prior art high frequency wiring board.

FIG. 4 is a diagram showing the reflection coefficient versus frequency characteristics of the respective high frequency wiring substrates. The frequency (unit: GHz) is plotted along the horizontal axis, and the reflection coefficient S11 (unit: dB) along the vertical axis. Of the characteristic curves, the solid curve represents the results of the measurements made on the high frequency wiring substrate A of the present embodiment, and the dashed line shows the results of the high frequency wiring substrate B of the comparative example. As shown in FIG. 4, the rate of increase of the reflection coefficient S11 with increasing frequency is held lower in the high frequency wiring substrate A of the embodiment than in the high frequency wiring substrate B of the comparative example, achieving good reflection characteristics and good high frequency transmission characteristics with the reflection coefficient S11 held low in the high frequency regions.

As a result, in the high frequency wiring substrate of the invention, the increase in the inductance component associated with the signal conducting through-hole conductors 18 and 19 connecting the surface transmission line conductors 12 and 13 to the interlayer transmission line conductor 14 can be held low. Furthermore, the wavelength of the standing wave occurring between the discontinued points at the signal conducting through-hole conductors 18 and 19 connected to both ends of the interlayer transmission line conductor 14 can be shifted to a frequency region higher than the frequency of the high frequency signal. Moreover, the cutoff frequency in the dielectric waveguide transmission line structure, formed by the two top-to-bottom through-hole ground conductor arrays 20 arranged parallelly on both sides of the interlayer transmission line conductor 14 and the surface ground conductors 12 and 13 connected by the ground conductor arrays 20, can also be shifted to a frequency region higher than the frequency of the high frequency signal. It has therefore been confirmed that the high frequency wiring substrate of the invention achieves the transmission line interconnect structure having good high frequency transmission characteristics.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A wiring substrate for high frequency applications, comprising:

a pair of surface transmission line conductors formed in line with each other on upper and lower surfaces of a dielectric substrate composed of a stack of dielectric layers, each of the surface transmission line conductors being surrounded by a surface ground conductor; and a transmission line interconnect structure for transmitting a high frequency signal between the pair of surface transmission line conductors via an interlayer transmission line conductor formed between the dielectric layers in such a manner as to be in line with and parallel to the pair of surface transmission lines, the interlayer transmission line conductor being surrounded by an interlayer ground conductor and connected at both ends thereof to the respective ends of the pair of surface transmission line conductors by signal conducting through-hole conductors, wherein in the transmission line interconnect structure, the surface ground conductors on the upper and lower surfaces are connected together via the interlayer ground conductor by top-to-bottom through-hole ground conductors arranged in two parallel arrays spaced a prescribed distance apart from each other on both sides of the interlayer transmission line conductor, while the interlayer ground conductor is connected to the surface ground conductors on the upper and lower surfaces by interlayer through-hole ground conductors arranged in an array at a prescribed pitch along each of two sides extending perpendicularly to the interlayer transmission line conductor; and the thickness of each of the dielectric layers, representing the spacing between the interlayer transmission line conductor and the respective surface transmission line conductors, and the length of a straight line section of the interlayer transmission line conductor between the signal conducting through-hole conductors are each set not larger than one quarter of a signal wavelength of the high frequency signal, while through-hole ground conductors for connecting the surface ground conductors on the upper and lower surfaces are formed in a region where the interlayer ground conductor is not formed between the interlayer transmission line conductor and the top-to-bottom through-hole ground conductors arranged parallelly on both sides of the interlayer transmission line conductor, and are arranged at a pitch not larger than a prescribed pitch that has the frequency of the high frequency signal as a cutoff frequency.

2. The wiring substrate for high frequency applications of claim 1, wherein the distance between the two arrays of top-to-bottom through-hole ground conductors is set about twice the spacing between the pair of surface transmission line conductors.

3. A wiring substrate for high frequency applications, comprising:

(a) a dielectric substrate composed of a stack of dielectric layers;

(b) a first surface transmission line conductor formed in a straight line on one surface of the dielectric substrate;

(c) a second surface transmission line conductor formed in a straight line on the other surface of the dielectric substrate;

(d) a first surface ground conductor formed to surround the first surface transmission line conductor;

(e) a second surface ground conductor formed to surround the second surface transmission line conductor; and (f) a transmission line interconnect structure for transmitting a high frequency signal between the first surface transmission line conductor and the second surface transmission line conductor, the transmission line interconnect structure comprising:

(f1) an interlayer transmission line conductor formed in a straight line between the dielectric layers;

(f2) an interlayer ground conductor formed between the dielectric layers in such a manner as to surround the interlayer transmission line conductor;

(f3) signal conducting through-hole conductors for connecting the first surface transmission line conductor to the interlayer transmission line conductor, and for connecting the second surface transmission line conductor to the interlayer transmission line conductor;

(f4) first through-hole ground conductors, arranged in two parallel arrays spaced a prescribed distance apart from each other on both side of the interlayer transmission line conductor, for connecting the first surface ground conductor to the second surface ground conductor via the interlayer ground conductor;

(f5) second through-hole ground conductors for connecting the first surface ground conductor to the interlayer ground conductor, and for connecting the second surface ground conductor to the interlayer ground conductor, the second through-hole ground conductors being arranged in an array at a prescribed pitch along each of two sides extending perpendicularly to the interlayer transmission line conductor; and (f6) third through-hole ground conductors for connecting the first surface ground conductor to the second surface ground conductor, the third through-hole ground conductors being formed in a region where the interlayer ground conductor is not formed between the interlayer transmission line conductor and the first through-hole ground conductors arranged parallelly on both sides of the interlayer transmission line conductor, wherein a thickness of each of the dielectric layers, representing the spacing between the interlayer transmission line conductor and the first and second surface transmission line conductors, and a length of a straight line section of the interlayer transmission line conductor between the signal conducting through-hole conductors are each set not larger than one quarter of a signal wavelength of the high frequency signal, and the third through-hole ground conductors are arranged at a pitch not larger than a prescribed pitch that has the frequency of the high frequency signal as a cutoff frequency.

* * * * *